(12) United States Patent
Lee et al.

(10) Patent No.: US 6,985,830 B2
(45) Date of Patent: Jan. 10, 2006

(54) METHOD OF MEASURING THE PROBABILITY OF FAILURE CAUSED ONLY BY DEFECTS, METHOD OF MEASURING DEFECT LIMITED YIELD, AND SYSTEM USING THE SAME

(75) Inventors: Dae-sung Lee, Seoul (KR); Jae-cheol Lee, Yongin (KR); Gook-tae Son, Yongin (KR); Jung-hee Kim, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 150 days.

(21) Appl. No.: 10/288,424

(22) Filed: Nov. 6, 2002

(65) Prior Publication Data

US 2003/0120459 A1 Jun. 26, 2003

(30) Foreign Application Priority Data

Dec. 20, 2001 (KR) ................ 2001-81963

(51) Int. Cl.
*H01L 21/66* (2006.01)
(52) U.S. Cl. .......................... 702/181; 438/16; 438/17
(58) Field of Classification Search ................ 702/181; 438/16, 17, 14
See application file for complete search history.

(56) References Cited

U.S. PATENT DOCUMENTS

| | | | |
|---|---|---|---|
| 5,497,381 A | * | 3/1996 | O'Donoghue et al. ...... 714/745 |
| 5,539,752 A | * | 7/1996 | Berezin et al. ............. 714/724 |
| 5,665,609 A | * | 9/1997 | Mori .......................... 438/16 |
| 5,971,586 A | * | 10/1999 | Mori .......................... 700/108 |

(Continued)

*Primary Examiner*—Marc S. Hoff
*Assistant Examiner*—Anthony Gutierrez
(74) *Attorney, Agent, or Firm*—Harness, Dickey & Pierce, P.L.C.

(57) ABSTRACT

A method of calculating a probability of failures caused only by defects, a method of calculating a defect limited yield using the classification of pattern parameters extracted only from the defects, and a system for calculating the probability of failure and the defect limited yield are provided. In one exemplary embodiment for calculating a probability of failures caused only by defects, defects are detected in inspected blocks that have defects and in blocks located around the inspected blocks to measure the number of inspected blocks that have failures caused by reasons other than the defects in the blocks located around the inspected blocks having defects (n1), the number of inspected blocks having no failures in the blocks located around the inspected blocks having the defects (n2), the number of inspected blocks having failures caused by defects in the inspected blocks having defects (n3), and the number of inspected blocks having no failures in the inspected blocks having defects (n4). The data (n1) through (n4) is then substituted in the following formula:

$$KR = 1 - \frac{1 - KR_1}{1 - KR_0},$$

where $$KR_0 = \frac{n1}{n1 + n2}$$

and $$KR_1 = \frac{n3}{n3 + n4}.$$

19 Claims, 7 Drawing Sheets

U.S. PATENT DOCUMENTS

| | | | |
|---|---|---|---|
| 6,017,771 A * | 1/2000 | Yang et al. | 438/7 |
| 6,324,481 B1 * | 11/2001 | Atchison et al. | 702/84 |
| 6,338,001 B1 * | 1/2002 | Steffan et al. | 700/121 |
| 6,367,040 B1 * | 4/2002 | Ott et al. | 714/724 |
| 6,389,323 B1 * | 5/2002 | Yang et al. | 700/110 |
| 6,496,788 B1 * | 12/2002 | Kikuchi | 702/181 |
| 6,496,958 B1 * | 12/2002 | Ott et al. | 716/4 |
| 6,537,919 B1 * | 3/2003 | Wang | 438/710 |
| 6,605,478 B2 * | 8/2003 | Pnueli et al. | 438/14 |
| 6,687,633 B2 * | 2/2004 | Ono et al. | 702/83 |
| 6,741,940 B2 * | 5/2004 | Mugibayashi et al. | 702/35 |
| 2002/0052053 A1 * | 5/2002 | Ono et al. | 438/12 |
| 2003/0050761 A1 * | 3/2003 | Okabe et al. | 702/82 |
| 2003/0058436 A1 * | 3/2003 | Ono et al. | 356/237.2 |
| 2003/0120457 A1 * | 6/2003 | Singh et al. | 702/181 |
| 2003/0125903 A1 * | 7/2003 | Dobson | 702/181 |

* cited by examiner

METHOD OF MEASURING THE PROBABILITY OF FAILURE CAUSED ONLY BY DEFECTS, METHOD OF MEASURING DEFECT LIMITED YIELD, AND SYSTEM USING THE SAME

CROSS REFERENCED TO RELATED APPLICATIONS

This U.S. non-provisional patent application claims priority under 35 U.S.C. § 119 to Korean Patent Application No. 2001-81963 filed on Dec. 20, 2001, the contents of which are incorporated by reference.

BACKGROUND OF THE INVENTION

1. Field of the Invention

The present invention relates generally to a method and a system for analyzing defects in semiconductors. In particular, the present invention relates to a method of calculating the probability of failures caused by defects, a method of calculating a defect limited yield, and a system for calculating the probability of failures caused by defects.

2. Description of the Related Art

Several hundreds or millions of semiconductor chips are now mounted on a single wafer due to the extensive development of manufacturing techniques of semiconductor integrated circuits. As a result, the analysis of defects or electrical defects occurring during the integration of semiconductor chips is a step in the process of manufacturing semiconductors. Thus, defect analysis techniques to determine defects in semiconductors have been rapidly developed.

There are numerous methods of analyzing defects; however, most defects are measured by defect inspectors. The inspectors determine the presence of foreign materials on a semiconductor wafer, analyze defect data according to number, location, etc., and measure the electrical characteristics of semiconductor devices. Methods of analyzing defects using the probability of failures due to defects are well-known.

In a conventional method of calculating the probability of failures caused by defects, the probability of failures caused by the defects is measured in each of the inspected blocks of a wafer chip or in each of the wafer chips. As shown in FIG. 1, blocks 10 are inspected to determine whether defects D and/or failures F occur in inspected blocks 10. The inspection is performed in each of the chips of a wafer by general defect and failure detection equipment. In particular, a number N1 of the inspected blocks having the defects D in which the failures F occur, i.e., block 10-1, and a number N2 of inspected blocks in which failures F do not occur, i.e., block 10-2 are determined.

The probability of failures caused by the defects D, i.e., a hit ratio, is calculated using N1 and N2. In particular, the hit ratio is defined as a ratio of the number N1 of the inspected blocks having failures F caused by defects D to the sum (N1+N2) of the number N1 of the inspected blocks having failures F caused by defects D and the number N2 of the inspected blocks not having failures F caused by defects D, as illustrated in formula (1).

$$HR(Hit\ Ratio) = N1/(N1+N2) \quad (1)$$

A conventional hit ratio in each of the wafer chips is calculated by the following method. First, the number of defects is measured in each of the wafer chips using defect detection equipment. Next, if the number of defects is over a desired number, it is determined that the wafer chips fail. On the other hand, if the number of defects is below the desired number, it is determined that the wafer chips are good.

However, the conventional hit ratio has numerous problems. First, the number N1 of inspected blocks having defects in which failures occur includes the number of failures caused by defects and the number of failures caused by reasons other than defects. Thus, since the conventional hit ratio includes probabilities of failures caused by the defects as well as other causes, the conventional hit ratio does not reflect the probability of the failures caused by defects only.

Second, a hit ratio in each of the wafer chips identifies a good or bad state of the wafer chips using only the number of defects. However, if the defects are concentrated in only certain regions, the defects may have a fatal effect on the chips even though the number of the defects is small. In addition, even though the number of the defects is large, the defects may be disposed at large intervals and may not cause the failure of the wafer chips. Thus, it is inaccurate to measure a yield using the number of defects in the wafer chips.

SUMMARY OF THE INVENTION

At least one exemplary embodiment of the present invention provides a method of calculating the probability of failures caused by defects in each of the inspected blocks.

At least one exemplary embodiment of the present invention provides a method of measuring the probability of failures caused only by defects in each of the wafer chips.

At least one exemplary embodiment of the present invention provides a method of estimating the actual yield in each of the wafer chips using the probability of failures caused by defects in each of the wafer chips.

At least one exemplary embodiment of the present invention provides a system for estimating the probability of failures caused by defects and a wafer yield.

According to one or more exemplary embodiments of the present invention, there is provided a method of calculating a probability (KR) of failures caused only by defects in each of the inspected blocks in a wafer chip. In particular, defects are detected in blocks that have defects and in blocks located around the inspected blocks. A process performer obtains the number of inspected blocks having failures caused by reasons other than defects in the inspected blocks located around the inspected blocks having defect (n1), the number of inspected blocks having no failures in the inspected blocks located around the inspected blocks having the defects (n2), the number of inspected blocks having failures caused by defects in the inspected blocks having the defects (n3), and the number of inspected blocks having no failures in the inspected blocks having the defects (n4). The data n1 through n4 is then substituted in the formula 1a below:

$$KR = 1 - \frac{1 - KR_1}{1 - KR_0} \quad (1a)$$

$$\text{where } KR_0 = \frac{n1}{n1+n2} \text{ and } KR_1 = \frac{n3}{n3+n4}.$$

Inspected blocks around the inspected blocks are positioned in the upper left, the upper right, the lower left, and lower right directions from the inspected blocks. The inspected blocks around the inspected blocks are the eighth inspected blocks that border on each inspected block.

According to at least one exemplary embodiment of the present invention, there is provided a method of calculating a probability of failures caused only by defects in each of the chips of a wafer. More particularly, defects are detected in each of the wafer chips to determine the total number of chips having defects (m2) and the total number of chips which fail due to causes other than defects (m3). Wafer chips having defects are classified using probable parameters that take into consideration the area, size, and number of the defects to determine the total number of wafer chips (m4) and the total number of wafer chips which fail in a corresponding step when the wafer chips are classified according to each probable parameter (m5). A probability (KR) that the wafer chips fail due to defects only is calculated by substituting the data m2, m3, m4, and m5 in the following formula:

$$KR = 1 - \frac{1 - KR_1}{1 - KR_0},$$

where, $$KR_0 = \frac{m3}{m1 - m2}, KR_1 = \frac{m5}{m4},$$

m1 is the total number of wafer chips, m2 is the total number of wafer chips having defects, m3 is the number of wafer chips which fail due to causes other than defects, m4 is the total number of wafer chips in a corresponding step when the wafer chips are classified according to each probable parameter, and m5 is the number of wafer chips which fail in the corresponding step when the wafer chips are classified according to each probable parameter.

If the inspection of the defects is performed by an array method which inspects defects in cell regions, the probable parameters include the maximum area of defects in a chip, the maximum value of the sum of the areas of defects in a segment, the maximum value of the sum of the sizes of the defects in the segment, the maximum value of the total number of the defects in the segment, the sum of the areas of the defects in the chip, and the sum of the sizes of the defects in the chip, and the total number of defects in the chip.

If the inspection of the defects is performed by a random method which inspects defects in peripheral regions, the probable parameters include the probable parameters of the array method described above, as well as the maximum value of areas of defects in the peripheral regions of an X axis, the maximum value of the sizes of the defects in the peripheral regions of the X axis, the maximum value of the sum of the areas of defects in the peripheral regions around the left and right regions of the X axis, the maximum value of the sum of the sizes of the defects in the peripheral regions around the left and right regions of the X axis, the maximum value of the number of defects in the peripheral regions around the left and right regions of the X axis, the maximum value of the areas of the defects in peripheral regions of the Y axis, the maximum value of the sizes of the defects in the peripheral regions of the Y axis, the maximum value of the sum of the areas of the defects in the peripheral regions of the upper and lower regions of the Y axis, the maximum value of the sum of the sizes of the defects in the peripheral regions of the upper and lower regions of the Y axis, and the maximum value of the number of defects in the peripheral regions of the upper and lower regions of the Y axis.

In at least one exemplary embodiment of the present invention, there is provided a method of calculating the defect limited yield (DLY) using the method of calculating a probability that wafer chips fail due to defects only, and by using the formula set forth below:

$$DLY = \frac{k - \sum_{i}^{k} KRi}{k} \times 100\, (\%), i = 1$$

where k is the total number of wafer chips and KR is the probability that the wafer chips fail due to defects only.

In at least one exemplary embodiment of the present invention, there is provided a system for calculating the probability of failures caused only by defects in each inspected block. The system includes a defect detector, a controller, and a display unit. The defect detector detects defects in inspected blocks in a chip. The controller compares data obtained by the defect detector and layout information of the inspected blocks, and determines whether the failures are caused by defects. The display unit displays the information from the controller so that a process performer can monitor the displayed information. The controller includes a killing ratio calculator for comparing the detected information and layout information and calculating a probability of failure (KR) caused only by defects using the compared data.

In yet another exemplary embodiment of the present invention, there is provided a system for calculating the probability of failures caused by defects only in wafer chips. The system includes a defect detector, a controller, and a display unit. The defect detector detects defects in each of the wafer chips. The controller compares each datum obtained by the defect detector and layout information of the wafer chips, which is stored in advance, and determines whether failures are caused by the defects. The display unit displays information from the controller so that a process performer monitors the displayed information.

In this exemplary system, the controller includes a decision tree determiner, a killing ratio calculator, and a defect limited yield. The decision tree determiner compares detected defect information and layout information and classifies the compared data into probable parameters. The killing ratio calculator calculates a probability KR of failures caused only by defects using the detected defect information and the decision tree determiner. The defect limited yield calculator calculates defect limited yield (DLY) of a wafer using the probability KR.

BRIEF DESCRIPTION OF THE DRAWINGS

The present invention will become more apparent by describing in detail exemplary embodiments thereof with reference to the attached drawings in which.

DETAILED DESCRIPTION OF THE INVENTION

Figure 1:
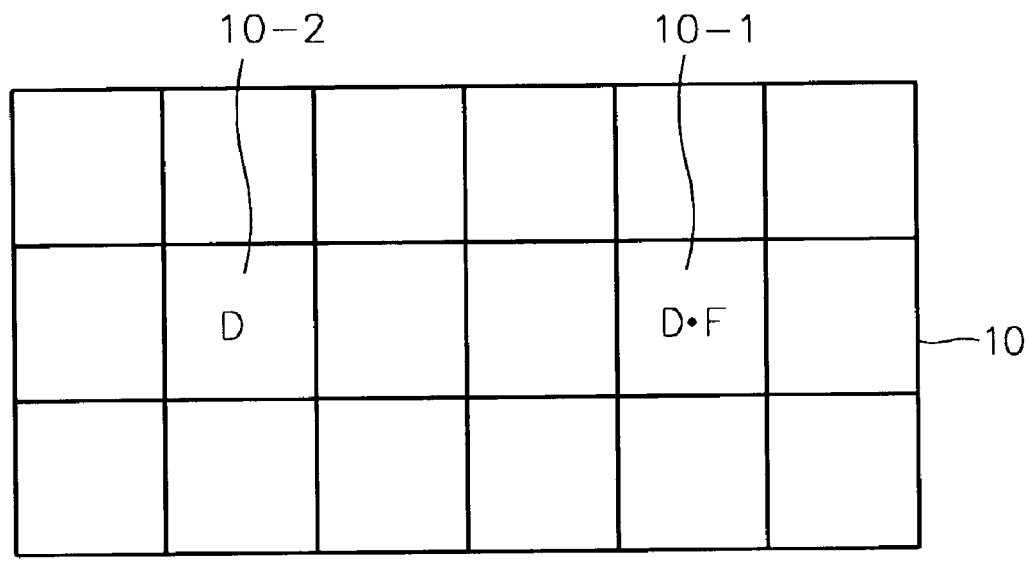
FIG. 1 is an illustration depicting a conventional method of measuring the probability of failures caused by defects in each of the inspected blocks of a wafer chip.

Hereinafter, exemplary embodiments of the present invention will be described in detail with reference to the attached drawings. However, the exemplary embodiments of the present invention can be modified into various other forms, and the scope of the present invention must not be interpreted as being restricted to the disclosed exemplary embodiments. The exemplary embodiments are provided to more completely explain the present invention to those of ordinary skilled in the art. In drawings, the thicknesses of layers or regions is exaggerated for clarity. Like reference numerals in the drawings denote the same members. Additionally, when it is written that a layer is formed "on" another layer or a substrate, the layer can be formed directly on the other layer or the substrate, or other layers can intervene therebetween.

Figure 2:
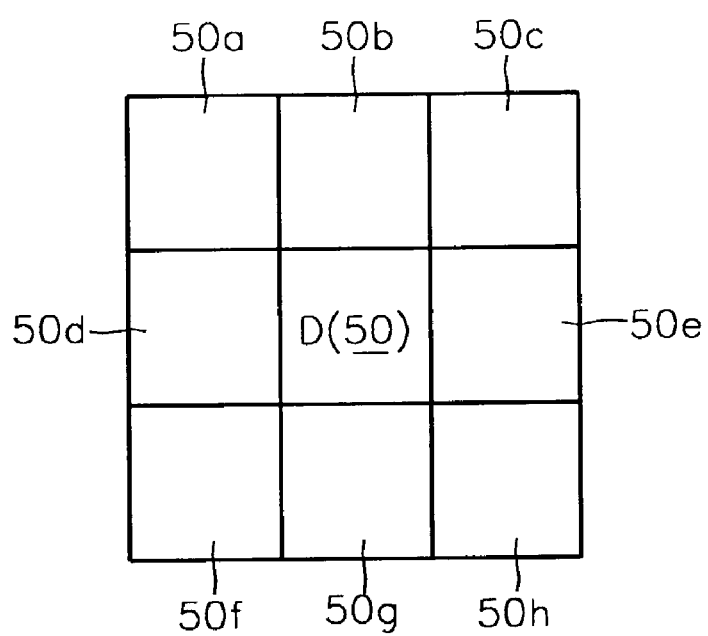
FIG. 2 is an illustration depicting a method of measuring the probability of failures caused by defects in each of the inspected blocks of a wafer chip according to a first exemplary embodiment of the present invention.
Figure 3:
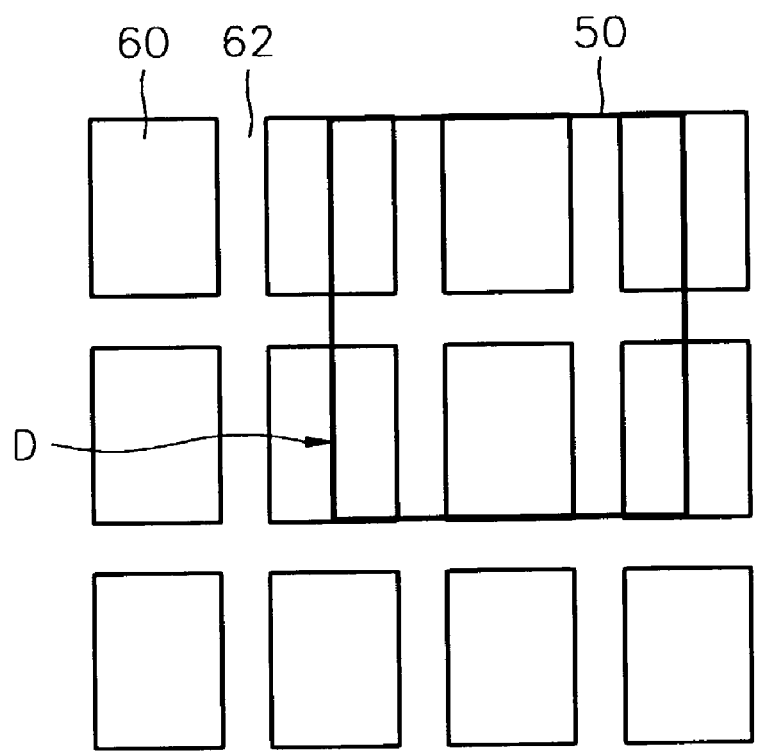
FIG. 3 is an illustration depicting cell regions and inspected blocks of a wafer chip according to the first exemplary embodiment of the present invention.

In FIG. 2, an illustration of a plurality of inspected blocks explaining a first exemplary embodiment of the present invention can best be seen. This exemplary embodiment calculates a probability of failures caused only by defects when such defects occur in each of the inspected blocks in chips. In addition, the inspected blocks in the first exemplary embodiment represent separated blocks of a chip to inspect cell bits of a semiconductor device. With reference to FIG. 3, which is an illustration depicting cell regions and inspected blocks to aid in describing the first exemplary embodiment, the inspected blocks include a plurality of cell regions 60 and a plurality of core regions 62.

Referring to FIG. 2, defect detection equipment is used to determine whether defects D are present. The blocks are inspected to determine whether failures are present in the inspected blocks 50b, 50d, 50e, and 50g in upper, lower, left and right directions with respect to the specific inspected block 50 or in inspected blocks 50a trough 50h surrounding the specific inspected block 50. The failures are detected by contrasting layout information of an inspected block (or a chip) and an inspected block in which an inspection is currently in progress.

A process performer can obtain the following data with respect to the eight peripheral inspected blocks 50a through 50h or the inspected blocks 50b, 50d, 50e, and 50g if the defects D occur in the specific inspected block 50. In other words, the process performer obtains the number n1 of inspected blocks having failures caused by reasons other than defects in the inspected blocks located around the inspected blocks that have defects (n1), the number of inspected blocks having no failures in the inspected blocks located around the inspected blocks having defects (n2), the number of inspected blocks having failures caused by defects in inspected blocks having defects (n3), and the number of inspected blocks having no failures in inspected blocks that have defects (n4).

Next, the process performer calculates a probability $KR_0$ of failures caused by reasons other than defects and a probability $KR_1$ of failures caused by defects using the data n1, n2, n3, and n4. The probabilities of $KR_0$ and $KR_1$ are given by formulas 2 and 3, respectively, as follows:

$$KR_0 = \frac{n1}{n1 + n2} \qquad (2)$$

$$KR_1 = \frac{n3}{n3 + n4}. \qquad (3)$$

A probability $1-KR_0$ that failures caused by reasons other than defects do not occur and a probability $1-KR_1$ that inspected blocks are normal can be obtained using the probabilities $KR_0$ and $KR_1$. The first probabilistic model of failure can be obtained using the probabilities $1-KR_0$ and $1-KR_1$ as follows:

Modelling 1:

In the probability $(1-KR_1)$, failures must not occur by causes other than defects $(1-KR_0)$ and failures must not occur by only defects $(1-KR)$.

The modelling 1 is described by equation 4 below:

$$(1-KR_1) = (1-KR_0) \times (1-KR) \qquad (4),$$

where KR represents the probability of failures caused only by defects. From formula 4, it follows that $$KR = 1 - \frac{1-KR_1}{1-KR_0}(KR_1 \geq KR_0), \qquad (5)$$

where the probability KR is called the "killing ratio".

When $KR_0$ is 1 in formula 5, failures occur in all inspected blocks around the defects. In other words, in a first example, a defect area exceeds an inspected block and, as a result, failures occur in all inspected blocks around the defect. In a second example, large block failures occur in a chip. Consequently, failures occur in inspected blocks even though the defects do not substantially affect the corresponding area. In this situation, $KR_0$ and $KR_1$ become close to 1 in the same ratio, considering the limit continuity, KR becomes 0.

Additionally, when defects occur on the interface between inspected blocks in inspecting defects (D of FIG. 3), the inspected blocks on the interface are not considered. Thus, the method of the first exemplary embodiment measures whether failures occur in inspected blocks having defects and in inspected blocks around the defects to obtain a probability of failures caused only by defects in the inspected blocks, i.e., a killing ratio.

A method of measuring a killing ratio (KR) in a wafer stage of a chip level and a defect limited yield (DLY) using the classification of pattern parameters extracted only from defects will now be described. Initially, each wafer chip is inspected by defect detection equipment. The methods of detecting defects on a wafer of a chip level include methods such as an array method and a random method. The array method, which only recognizes defects in cell regions in a memory chip, identifies patterns transformed by defects or other causes by comparing a first inspected cell and an adjacent cell. On the other hand, the random method, which detects defects in regions such as cell regions, core regions, and peripheral regions, identifies patterns transformed by defects or other causes by comparing an inspected chip and an adjacent chip. Therefore, the array method and the random method can be sequentially used.

Defect detection equipment includes KLA equipment and AIT equipment. Although KLA equipment supports both the array and random methods, it is time consuming. On the other hand, even though the AIT equipment supports only the random method, defects can be identified in a short time. Typically, both equipment are used in a process of identifying current defects.

Figure 4:
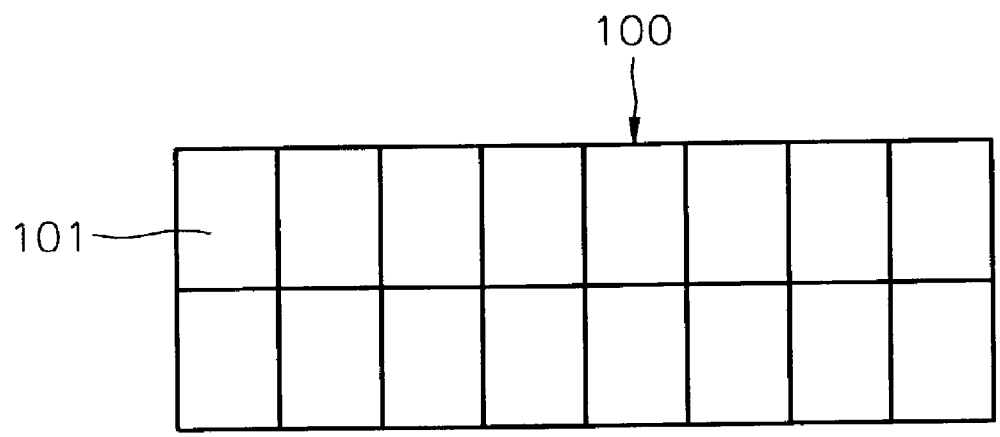
FIG. 4 is a plan view of a wafer chip which is separated into segments to explain a second exemplary embodiment of the present invention.

When detecting defects in chips, the number of defects is measured and the following conditions are considered to determine whether the chips are good dies. For example, as shown in FIG. 4, in a second exemplary embodiment, defect detection is performed by the array method in consideration of (1) the maximum area MAX AREA of defects in a chip 100, (2) the maximum size MAX SIZE of the defects in the chip 100, (3) the maximum area CMAX AREA of defects in a segment 101, (4) the maximum size CMAX SIZE of the defects in the segment 101, (5) the maximum value CMAX COUNT of the total number of defects in the segment 101, (6) the sum CASUM of the areas of the defects in the chip 100, (7) the sum CSSUM of the sizes of the defects in the chip 100, and (8) the total number CDCOUNT of defects in the chip 100 as well as the number of defects. In this exemplary embodiment, the segment 101 is a minimum block in which repair is performed. A memory chip may be divided into several segments. Additionally, the defect area represents a cross-sectional area of the defect, and the defect size represents the length of the major axis of a defect area.

In a defect inspection using the array method, (1) to (8) as set forth above are called probable parameters, i.e., (1) and (2) represent a single defect effect, (3) to (5) represent a cumulative effect in a segment, and (6) to (8) represent a cumulative effect in a chip. Additional software may be added to classify the probable parameters in the defect detection.

Defects are identified using these probable parameters by taking into consideration that each segment may be repaired since the defects are randomly distributed (even though the number of the defects is great) or failures may occur in a chip because the area and size of the defects are very large (even though the number of the defects is small). However, if more defects than the desired number are found in each segment, it is difficult to repair the respective segment. In that situation, the chip is rejected.

Figure 5:
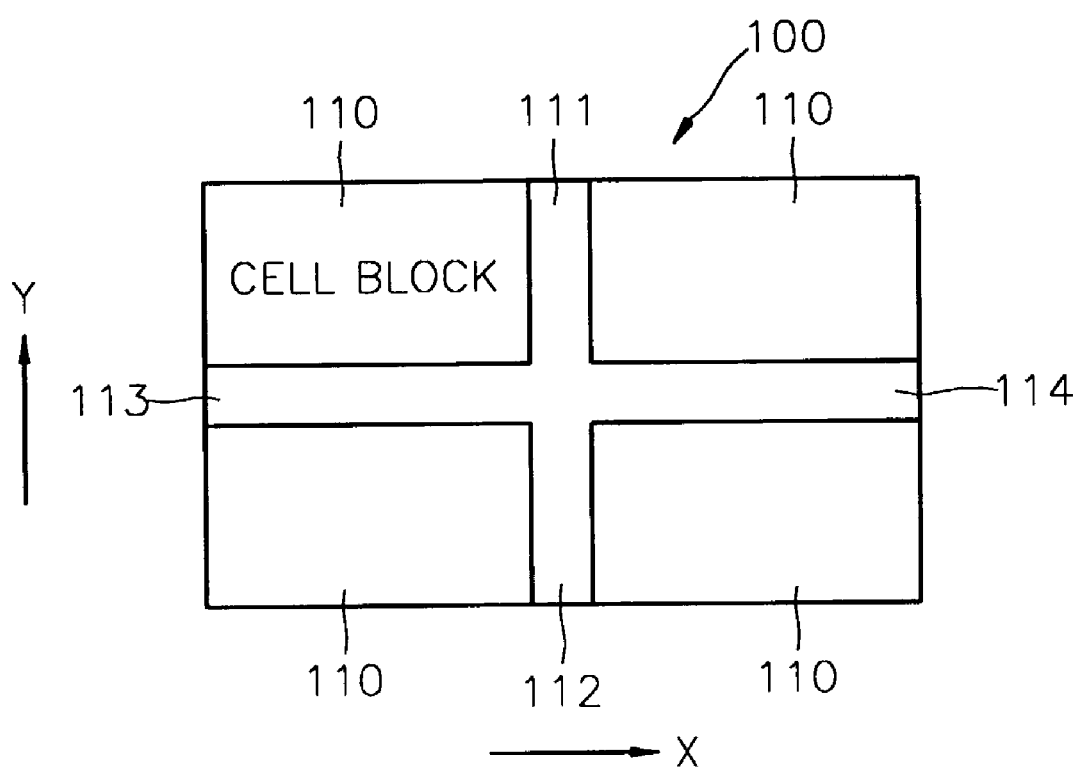
FIG. 5 is a plan view of a wafer chip which is separated into cell blocks to explain the second exemplary embodiment of the present invention.

A method of detecting defects by the random method will now be described. As in the array method the probable parameters are applied. However, unlike the array method, the random method concentrates on peripheral regions 111, 112, 113, and 114 in detecting defects, as illustrated in FIG. 5.

The random method identifies the defects in consideration of (a) the maximum area XMAXAREA of defects in the peripheral regions 113 and 114 in the X axis, (b) the maximum size XMAXSIZE of the defects in the peripheral regions 113 and 114 in the X axis, (c) the maximum value XBMAXAREA of the sum of the areas of the defects in the peripheral regions 113 and 114 around the left and right regions of the X axis, (d) the maximum value XBMAXSIZE of the sum of the sizes of the defects in the peripheral regions 113 and 114 around the left and right regions of the X axis, (e) the maximum value XBMAXCOUNT of the total number of defects in the peripheral regions 113 and 114 around the left and right regions of the X axis, (f) the maximum area YMAXAREA of the defects in the peripheral regions 111 and 112 around the Y axis, (g) the maximum size YMAXSIZE of the defects in the peripheral regions 111 and 112 around the Y axis, (h) the maximum value YBMAXAREA of the sum of the areas of the defects in the peripheral regions 111 and 112 around upper and lower regions of the Y axis, (i) the maximum value YBMAXSIZE of the sum of the sizes of the defects in the peripheral regions 111 and 112 around upper and lower regions of the Y axis, (j) the maximum value XBMAXCOUNT of the total number of defects in the peripheral regions 111 and 112 around upper and lower regions of the Y axis. Here, (a) and (b) represent a single defect effect in the peripheral regions 113 and 114 of the X axis, (c) to (e) represent a cumulative effect in the peripheral regions 113 and 114 of the X axis, (f) and (g) represent a single defect effect in the peripheral regions 111 and 112 of the Y axis, and (h) to (j) represent a cumulative effect in the peripheral regions 111 and 112 of the Y axis.

Figure 6:
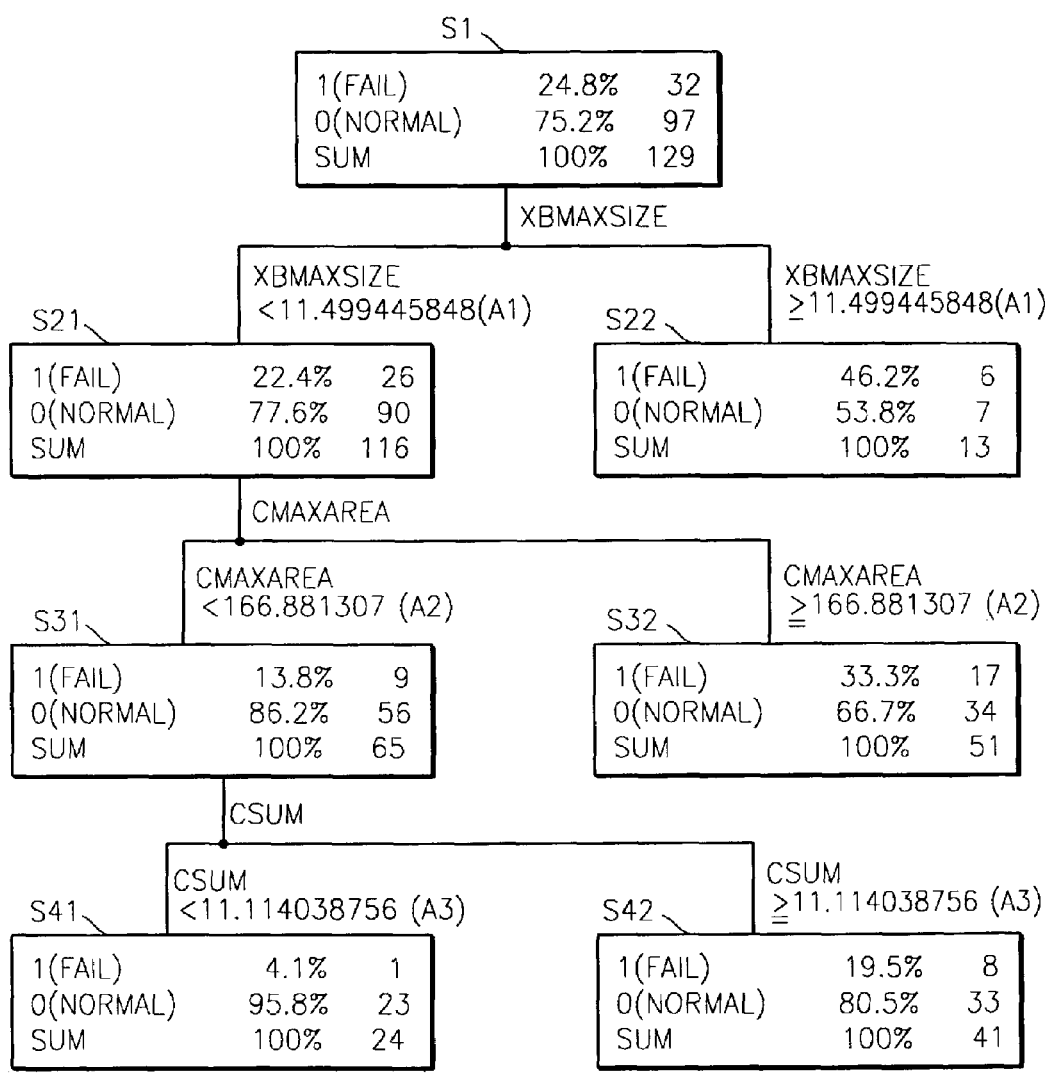
FIG. 6 is a flowchart illustrating a decision tree according to the second exemplary embodiment of the present invention.

In the random method, the process performer obtains data on the number of chips which fail and data on the number of chips which do not fail in each of the parameters (1)–(8) and (a)–(j) when inspecting defects in consideration of the probable parameters (1)–(8) and (a)–(j). A chart (hereinafter referred to as a decision tree), as shown in FIG. 6, can be obtained from this data. The decision tree classifies chips which fail and chips which do not fail using the previously described parameters (1)–(8) and (a)–(j) without limiting the number of defects as in the methods of the prior art. Ultimately, the decision tree decides whether the chips fail as a direct result of defects in consideration of the size, number, and area of the defects.

FIG. 6 illustrates that the inspection results are classified into several of the parameters (1)–(8) and (a)–(j) described above. In FIG. 6, a wafer having 200 chips is described. Supposing that the number of chips in which defects are found is 129 and the number of chips in which defects are not found is 71, the following classification occurs.

The 129 chips having defects are classified into chips "1" which fail and chips "0" which do not fail in step S1. In this example, the number of the chips "1" which fail is 32, which amounts to 24.8% of the 129 chips that have defects, and the number of chips "0" which do not fail is 97, which amounts to approximately 75.2% of the 129 chips that have defects.

The 129 chips are then re-classified based on the maximum value XBMAXSIZE of the sum of the sizes of the defects in the peripheral regions of the X-axis, as shown in steps S21 and S22. Here, step S21 represents a situation where the maximum value XBMAXSIZE of the sum of the sizes of the defects in the peripheral regions around right and left regions of the X axis is less than the reference value 1.499445848 $\mu$m (A1). Step S22 represents a case where the maximum value XBMAXSIZE of the sum of the sizes of the defects in the peripheral regions around the right and left regions of the X axis is the reference value 1.499445848 $\mu$m (A1) or more. The situation where the maximum value XBMAXSIZE of the sum of the sizes of the defects in the peripheral regions around the left and right regions of the X axis is less than the reference value 1.499445848 $\mu$m (A1) corresponds to 116 out of the 129 chips, and from these 116 chips, 26 are failure chips and 90 are not failure chips. The case where the maximum value XBMAXSIZE of the sum of the sizes of the defects in the peripheral regions around left and right regions of the X axis is the reference value 1.499445848 µm (A1) or more corresponds to 13 out of the 129 chips, and from these 13 chips, 6 are failure chips and 7 are not failure chips.

The case where the maximum value XBMAXSIZE of the sum of the sizes of defects in the peripheral regions around the left and right regions of the X axis is less than the reference value 1.499445848 µm (A1) is classified based on the maximum value CMAXAREA of the sum of the areas of the defects in each segment, as shown in steps S31 and S32. Here, step 31 represents a situation where the maximum value CMAXAREA of the sum of the areas of the defects in each segment is less than a reference value 166.881307 µm² (A2). Step 32 represents a situation where the maximum value CMAXAREA of the sum of the areas of the defects in each segment is the reference value 166.881307 µm² (A2) or more. The situation where the maximum value CMAXAREA of the sum of the areas of the defects in each segment is less than a reference value 166.881307 µm² (A2) corresponds to 65 out of 116 chips, and from these 65 chips, 9 are failure chips and 57 are not failure chips. The case where the maximum value CMAXAREA of the sum of the areas of the defects in each segment is the reference value 166.881307 µm² (A2) or more corresponds to 51 out of 116 chips, and from these 51 chips 17 are failure chips and 34 are not failure chips.

The situation where the maximum value CMAXAREA of the sum of the areas of the defects in each segment is less than a reference value 166.881307 µm² (A2) is re-classified based on the sum CASUM of the areas of the defects in a chip, as shown in step 41 and 42. Step 41 represents a situation where the sum CASUM of the areas of the defects in the chip is less than a reference value 11.114038756 µm² (A3). Step 42 represents a situation where the sum CASUM of the areas of the defects in the chip is the reference value 11.114038756 µm² (A3) or more. The situation where the sum CASUM of the areas of the defects in the chip is less than a reference value 11.114038756 µm² (A3) corresponds to 24 out of 65 chips, and from these 24 chips, 1 is a failure chip and 23 are not failure chips. The situation where the sum CASUM of the areas of the defects in the chip is the reference value 11.114038756 µm² (A3) or more corresponds to 41 out of 65 chips, and from these 41 chips, 8 are failure chips and 33 are not failure chips.

Although FIG. 6 illustrates the use of three parameters in the classification, the method can include all or any combination of the 18 parameters (1)–(8) and (a)–(j) described above.

A killing ratio in each node, i.e., in each step, can be obtained from the decision tree. In other words, a probability $KR_0$ that chips having no defects are rejected can be calculated from the decision tree by formula 6 shown below:

$$KR_0 = \frac{m3}{m1-m2}, \tag{6}$$

where m1 represents the total number of chips (200 in this exemplary embodiment), m2 represents the number of chips having defects (129 in this exemplary embodiment), and m3 represents the number of chips which fail by causes other than defects (which may be identified by detection equipment).

A probability $KR_1$ that chips having defects fail can be calculated from the decision tree and may vary in each of the nodes S1, S2, S32, and S42. In this exemplary embodiment, a probability $KR_1$ that chips having defects fail is given as an example in the first step S1 by formula 7:

$$KR_1 = \frac{m5}{m4}, \tag{7}$$

where m4 represents the total number of chips in each step (e.g., 129 in the situation of step S1) and m5 represents the number of chips which fail in the corresponding step S32.

A probability that chips having no defects are normal, i.e., a probability $1-KR_0$ that the chips do not fail by causes other than defects and a probability $1-KR_1$ that the chips having defects are normal, can be determined from the probabilities $KR_0$ and $KR_1$. The second probabilistic model of failures can be obtained using the probabilities $1-KR_0$ and $1-KR_1$ as follows:

Modelling 2:

The probability of $1-KR_1$ that the chips having defects are normal represents that the chips do not fail by causes other than defects $(1-KR_0)$ and the chips also do not fail only by defect $(1-KR)$.

This modelling 2 is described by formula 8 below:

$$(1-KR_1)=(1-KR_0)\times(1-KR) \tag{8}$$

where KR represents the probability that chips fail only by defects. From formula 8, it follows that $$KR = 1 - \frac{1-KR_1}{1-KR_0}(KR_1 \geq KR_0). \tag{9}$$

The probability KR, i.e., a killing ratio, in a wafer chip is obtained from formula 9 in each wafer chip in consideration of the probable parameters.

In addition, the defects effects on wafer yield, i.e., defect limited yield, can be obtained using the probability KR. For example, a probability KR that a plurality of chips on a wafer fail by defects only is obtained in each chip. The probabilities KR in all the chips on the wafer are summed, and if the sum is, for example, 8.3481, it is estimated that 8.3481 chips fail due to defects. If the number of chips in a wafer is 200, the wafer has a limiting yield of about 95.83% [{(200−8.3421)/200}×100]. In this example, 95.83% is the defect limited yield, which is represented by formula 10:

$$DLY = \frac{k - \sum_{i}^{k} KRi}{k} \times 100(\%), \tag{10}$$

where k represents the total number of wafer chips.

A killing ratio in each wafer chip can be numerically estimated using the probable parameters. Thus, the defect limited yield (DLY) in each step of a process can be accurately calculated. Also, a defect management level on each layer can be obtained using the killing ratio. In other words, the defect detection on layers having a high defect killing ratio may be tightly conducted and the defect detection on layers having a low killing ratio may be loosely conducted. As a result, the inspection of wafer samples can be accurately managed and high priced defect detection equipment can operate effectively.

Moreover, the degree by which defects occurring in a semiconductor process affects the actual semiconductor yield is estimated before the semiconductor process is completed, i.e., when the defects are detected. Thus, costs of the manufacturing semiconductor process can be reduced by treating the estimated low yield lot and the low yield generating equipment can be identified, repaired, or stopped from being used.

Figure 7:
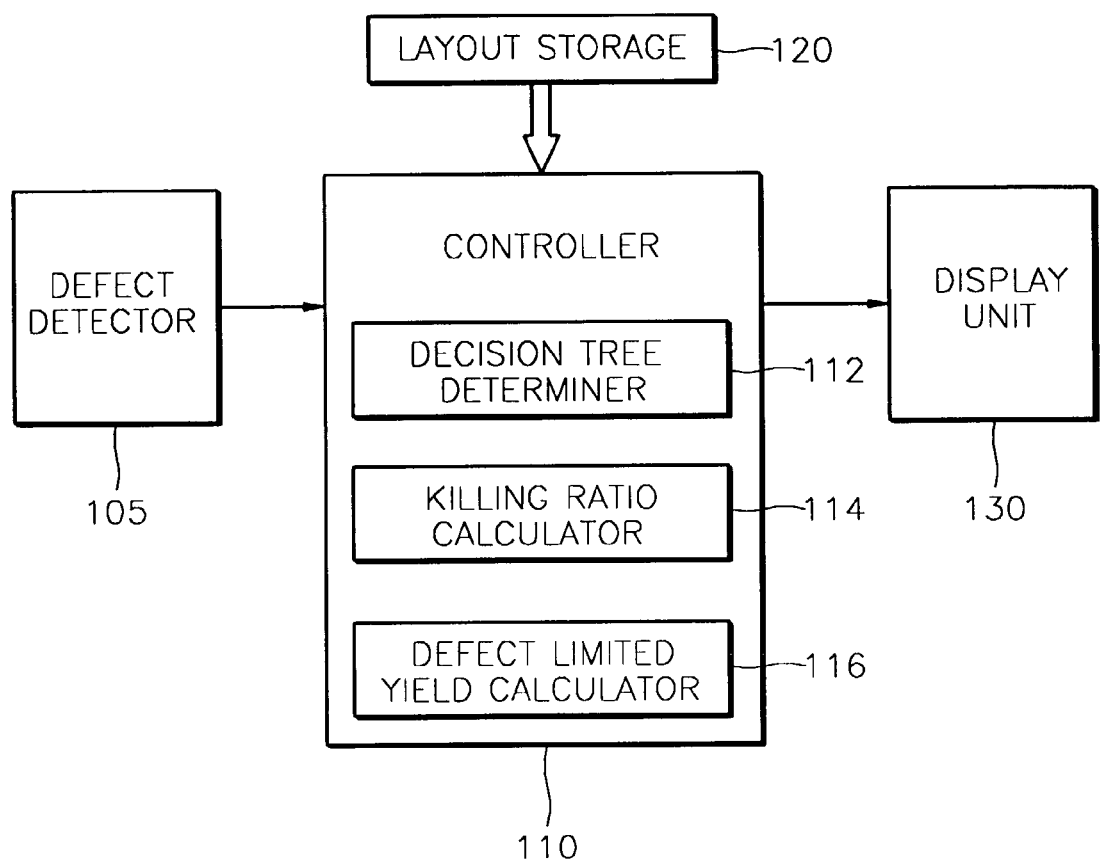
FIG. 7 is a schematic block diagram of a preliminary management system for calculating a killing ratio and a defect limited yield according to a third exemplary embodiment of the present invention.
Figure 8:
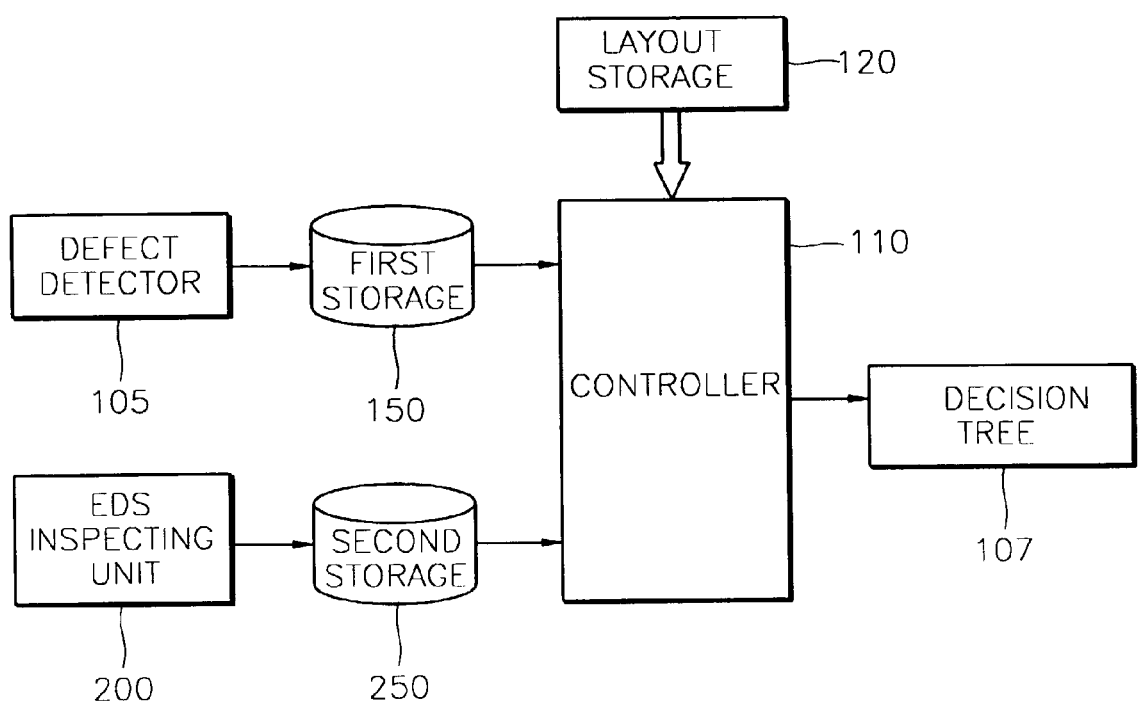
FIG. 8 is a block diagram of a post management system for calculating a killing ratio and a defect limited yield according to the third exemplary embodiment of the present invention.
Figure 9:
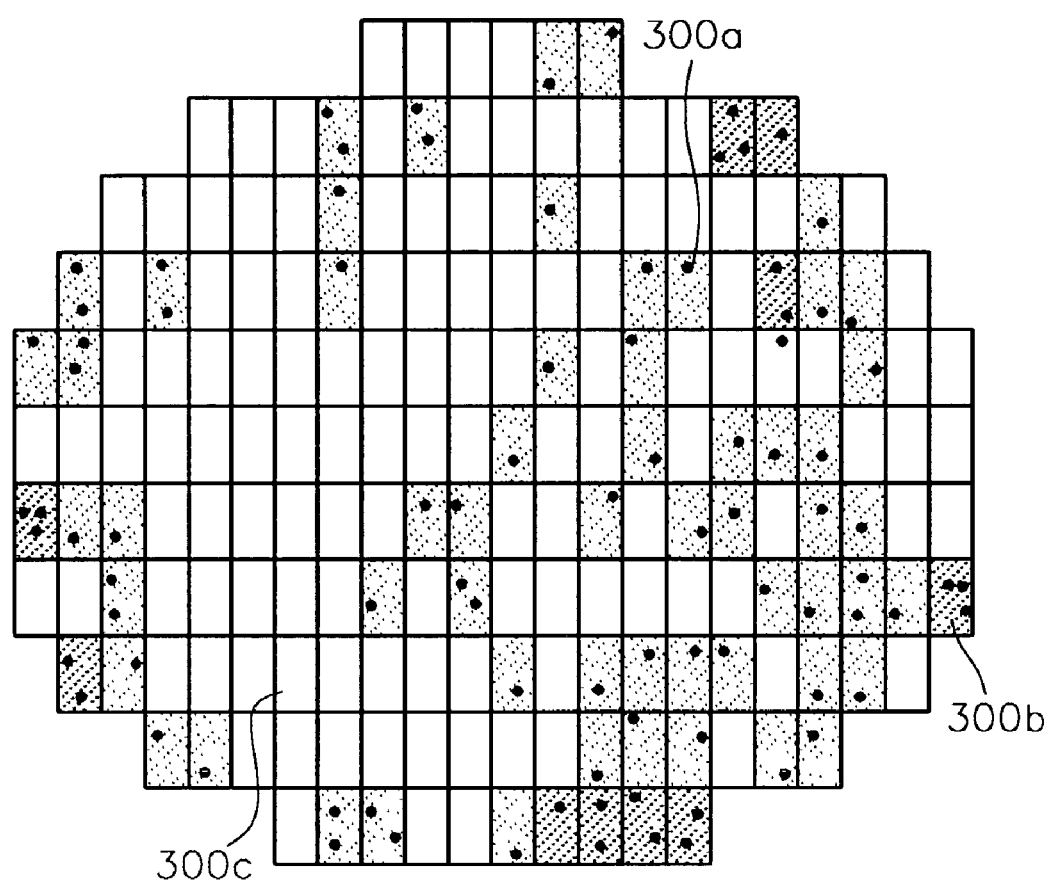
FIG. 9 is a map showing failures caused by defects in each of the wafer chips.

Referring now to FIGS. 7–9, a system for calculating a killing ratio and defect limited yield and a method of operating this system can best be seen. As shown in FIG. 7, a preliminary management system includes a defect detector 105, a controller 110, and a display unit 130. The defect detector 105 checks for defects in blocks in a chip and in a wafer chip. The controller 110 determines whether the defects cause the chips to fail by comparing each datum inspected in the defect detector 105 with layout information of the inspected blocks and the wafer chips. The display unit 130 displays the information from the controller 110. The layout information of the inspected blocks and the wafer chip is stored in a layout storage 120 and is provided via software.

The controller 110 includes a decision tree determiner 112, a killing ratio calculator 114, and a defect limited yield calculator 116. The decision tree determiner 112 compares detected defect information and layout information and then calculates a decision tree for classifying the compared data using probable parameters. The killing ratio calculator 114 calculates a killing ratio (KR) using the detected defect information and the decision tree determiner 112. The defect limited yield calculator 116 calculates the defect limited yield (DLY) of a wafer using the killing ratio. The display unit 130 displays the analysis result of the failures caused by defects in each inspected block and wafer chip.

When defects are detected in each of the inspected blocks as in the first exemplary embodiment, only the killing ratio is calculated using only the defect information in the defect detector 105 and layout information of the layout storage 120. The decision tree determiner 112 and the defect limited yield calculator 116 do not operate.

When defects are detected in each of the wafer chips as in the second exemplary embodiment, the decision tree determiner 112, the killing ratio calculator 114, and the defect limited yield calculator 116 are all operated. Thus, a decision tree 107 is obtained using defect data, and a killing ratio and defect limited yield are calculated using the decision tree. The decision tree determiner 112, the killing ratio calculator 114, and the defect limited yield calculator 116 are embedded in the controller 110 as software.

In FIG. 9, a defect map showing chips 300a having defects, chips 300b having failures caused by the defects, and chips 300c having no defects can be seen. A process performer can monitor in real time the number of defects and failures caused by the defects.

A preliminary management system according to a third exemplary embodiment is described below. A situation where defects are detected in each of the inspected blocks will first be described.

To begin with, the defect detector 105 checks for defects in each of the inspected blocks. Next, detected defect information is compared with layout information from each inspected block stored in the layout storage 120 and is then analyzed in the controller 110. The controller 110 obtains the number n1 of inspected blocks having failures caused by reasons other than defects, the number n2 of inspected blocks having no failures, the number n3 of inspected blocks having failures caused by defects, and the number n4 of inspected blocks having no failures from the inspected blocks that have defects. The killing ratio calculator 114 calculates a killing ratio (KR) using data n1 through n4 by the method described in the first exemplary embodiment. The controller 110 then transmits a control signal including the KR to the display unit 130, and the display unit 130 displays the KR in each of the inspected blocks.

A method of detecting defects in all of the chips of a wafer will now be described.

First, the defect detector 105 checks for defects in each of the inspected blocks. Detected defect information is compared with layout information from each wafer chip stored in the layout storage 120 and is then analyzed in the controller 110. A decision tree, such as that shown FIG. 6, is obtained in the decision tree determiner 112 in consideration of the detected defect information, the layout information, and the probable parameters mentioned in the second exemplary embodiment. The killing ratio calculator 114 calculates a KR in each wafer chip using the result of the decision tree determiner 112 as presented in the second exemplary embodiment. Next, the defect limited yield calculator 116 calculates the defect limited yield of a wafer using the calculated KR.

A probability that failures caused only by defects, i.e., the killing ratio and defect limited yield of a wafer, are obtained by detecting defects during the semiconductor manufacturing process. Thus, the effects of the defects can be accurately determined in each semiconductor layer and in each piece of manufacturing equipment.

Referring to FIG. 8, a block diagram of a post management system according to the third exemplary embodiment can best be seen. The post management system creates a decision tree 107 using defect information obtained from the preliminary management system, which will be provided to the preliminary management system. The post management system includes a defect detector 105, a first storage 150, an EDS inspecting unit 200, a second storage 250, and a controller 110. The first storage 150 stores defect information detected by the defect detector 105. The EDS inspecting unit 200 inspects whether cell regions are turned on or off. The second storage 200 stores the on/off data of the cell regions inspected in the EDS inspecting unit 200. The controller 110 compares data from the first storage 150 and the second storage 250 with layout information stored in the layout storage 120, classifies the compared and analyzed data into probable parameters, and creates a decision tree 107.

Referring to FIG. 8, a block diagram of a post management system according to the third exemplary embodiment can best be seen. The post management system creates a decision tree 107 using defect information obtained from the preliminary management system, which will be provided to the preliminary management system. The post management system includes a defect detector 105, a first storage 150, an Electrical Data Sorting Test (EDS) inspecting unit 200, a second storage 250, and a controller 110. The first storage 150 stores defect information detected by the defect detector 105. The EDS inspecting unit 200 inspects whether cell regions are turned on or off. The second storage 200 stores the on/off data of the cell regions inspected in the EDS inspecting unit 200. The controller 110 compares data from the first storage 150 and the second storage 250 with layout information stored in the layout storage 120, classifies the compared and analyzed data into probable parameters, and creates a decision tree 107.

As described above in detail, according to exemplary embodiments of the present invention, a probability that failures caused only by defects in each inspected block and in each wafer chip, i.e., a killing ratio, can be numerically estimated using only the defect detection data. Additionally, in each wafer chip, defect limited yield (DLY) can be accurately determined in each step of a semiconductor manufacturing process using the killing ratio. As a result, the detection of defects in each layer can be either tightly or loosely performed, depending on whether the killing ratio is high or low. Thus, the inspection of wafer samples can be accurately managed and high priced defect detection equipment can be efficiently operated.

Moreover, the degree by which defects occurring during a semiconductor manufacturing process limits the actual yield can be estimated before the semiconductor process is completed, i.e., at the time when the defects are detected. Thus, an estimated low yield lot can be treated in order to reduce costs in the semiconductor manufacturing process. In addition, the equipment causing the low yield can be identified and repaired, or stopped from being used.

It is noted that the functional blocks in FIGS. 7–8 may be implemented in hardware and/or software. The hardware/software implementations may include a combination of processor(s) and article(s) of manufacture. The article(s) of manufacture may further include storage media and executable computer program(s). The executable computer program(s) may include the instructions to perform the described operations. The computer executable program(s) may also be provided as part of externally supplied propagated signal(s) either with or without carrier wave(s).

While this invention has been particularly shown and described with reference to preferred exemplary embodiments thereof, it will be understood by those skilled in the art that various changes in form and details may be made therein without departing from the spirit and scope of the invention as defined by the appended claims.

What is claimed is:

1. A method of calculating a probability of failures (KR) caused only by defects in blocks in a wafer chip comprising:
   inspecting said blocks to detect defects in said blocks and in blocks located around said inspected blocks;
   measuring the number of said inspected blocks having failures caused by a reason other than said defects in said inspected blocks located around said inspected blocks having said defects (n1);
   measuring the number of said inspected blocks having no failures in said inspected blocks located around said inspected blocks having said defects (n2);
   measuring the number of inspected blocks having failures caused by said defects in said inspected blocks having said defects (n3);
   measuring the number of inspected blocks having no failures in said inspected blocks having said defects (n4); and
   substituting data (n1) through (n4) in formula 1a $$KR = 1 - \frac{1 - KR_1}{1 - KR_0};$$ (1a)

wherein $KR_0 = \frac{n1}{n1 + n2}$ and $KR_1 = \frac{n3}{n3 + n4}$.

2. The method of claim 1, wherein said inspected blocks located around said inspected blocks are positioned in upper left, upper right, lower left, and lower right directions from said inspected blocks.

3. The method of claim 1, wherein said inspected blocks located around said inspected blocks are eight inspected blocks surrounding inspected block.

4. The method of claim 1, wherein when $KR_0$ is one, failures occur in all of said inspected blocks located around said inspected blocks having said defects.

5. The method of claim 1, wherein $KR_0$ represents a probability of failures caused by reasons other than said defects.

6. The method of claim 1, wherein $KR_1$ represents a probability of failures caused by said defects.

7. A method of calculating a probability of failures caused only by defects in each chip of a wafer comprising the steps of:
   determining the total number of wafer chips (m1);
   detecting defects in each said wafer chip;
   determining the total number of chips having said defects (m2);
   determining the total number of chips which fail due to a reason other than said defects (m3);
   classifying said wafer chips having defects using probable parameters in consideration of area, size, and number of said defects;
   determining the total number of wafer chips (m4) and the total number of wafer chips which fail (m5) when said wafer chips are classified according to each said probable parameter; and
   calculating a probability (KR) that said wafer chips fail only due to said defects by substituting the data m1, m2, m3, m4, and m5 in the formula:

$$KR = 1 - \frac{1 - KR_1}{1 - KR_0},$$

wherein $KR_0 = \frac{m3}{m1 - m2}$ and $KR_1 = \frac{m5}{m4}$.

8. The method of claim 7, wherein said inspection of said defects is performed by an array method which inspects said defects in cell regions.

9. The method of claim 8, wherein said probable parameters of said array method include a maximum area of defects in a chip, a maximum value of the sum of areas of said defects in a segment, a maximum value of the sum of sizes of said defects in said segment, a maximum value of the total number of said defects in said segment, a sum of areas of said defects in said chip, a sum of sizes of said defects in said chip, a total number of said defects in said chip.

10. The method of claim 7, wherein said inspection of said defects is performed by a random method which inspects defects in peripheral regions.

11. The method of claim 10, wherein said probable parameters include at least one of maximum area of defects in a chip, a maximum value of the sum of areas of said defects in a segment, a maximum value of the sum of sizes of said defects in said segment, a maximum value of the total number of said defects in said segment, a sum of areas of said defects in said chip, a sum of sizes of said defects in said chip, a total number of said defects in said chip, a maximum value of areas of said defects in peripheral regions of an X axis, a maximum value of the size of said defects in said peripheral regions of the X axis, a maximum value of the sum of the areas of said defects in peripheral regions around left and right regions of the X axis, a maximum value of the sum of sizes of said defects in said peripheral regions around said left and right regions of the X axis, a maximum value of the number of said defects in said peripheral regions around said left and right regions of the X axis, a maximum value of areas of said defects in peripheral regions of a Y axis, a maximum value of the size of said defects in said peripheral regions of the Y axis, a maximum value of the sum of areas of said defects in peripheral regions of upper and lower regions of the Y axis, a maximum value of the sum of sizes of said defects in said peripheral regions of upper and lower regions of the Y axis, and a maximum value of the number of said defects in said peripheral regions of said upper and lower regions of the Y axis.

12. The method of claim 11, wherein a process performer obtains data on chips which fail and chips which do not fail in each of said probable parameters and wherein a decision tree is obtained from said data which classifies said chips which fail and said chips which do not fail using said probable parameters.

13. The method of claim 7, wherein said probable parameters include a maximum value of areas of said defects in peripheral regions around the X axis, a maximum value of sizes of said defects in said peripheral regions around the X axis, a maximum value of the sum of said areas of said defects in peripheral regions around left and right regions of the X axis, a maximum value of the sum of sizes of said defects in said peripheral regions around said left and right regions of the X axis, a maximum value of the number of said defects in said peripheral regions around said left and right regions of the X axis, a maximum value of areas of said defects in peripheral regions around the Y axis, a maximum value of sizes of said defects in said peripheral regions around the Y axis, a maximum value of the sum of areas of said defects in peripheral regions of upper and lower regions of the Y axis, a maximum value of the sum of sizes of said defects in said peripheral regions of said upper and lower regions of the Y axis, and a maximum value of the number of said defects in said peripheral regions of said upper and lower regions of the Y axis.

14. A method of calculating a defect limited yield (DLY) comprising:
   inspecting said blocks to detect defects in said blocks and in blocks located around said inspected blocks;
   measuring the number of said inspected blocks having failures caused by a reason other than said defects in said inspected blocks located around said inspected blocks having said defects (n1);
   measuring the number of said inspected blocks having no failures in said inspected blocks located around said inspected blocks having said defects (n2);
   measuring the number of inspected blocks having failures caused by said defects in said inspected blocks having said defects (n3);
   measuring the number of inspected blocks having no failures in said inspected blocks having said defects (n4);
   substituting data (n1) through (n4) in formula 1a $$KR = 1 - \frac{1-KR_1}{1-KR_0};$$ (1a)

-continued
wherein $KR_0 = \frac{n1}{n1+n2}$ and $KR_1 = \frac{n3}{n3+n4}$; and substituting KR into formula:

$$DLY = \frac{k - \sum_{i}^{k} KRi}{k} \times 100(\%),$$

wherein i is 1 to k;
   wherein k is the total number of wafer chips; and
   wherein KR is the probability that wafer chips fail.

15. A method of calculating a defect limited yield (DLY) comprising:
   determining the total number of wafer chips (m1);
   detecting defects in each said wafer chip;
   determining the total number of chips having said defects (m2);
   determining the total number of chips which fail due to a reason other than said defects (m3);
   classifying said wafer chips having defects using probable parameters in consideration of area, size, and number of said defects;
   determining the total number of wafer chips (m4) and the total number of wafer chips which fail (m5) when said wafer chips are classified according to each said probable parameter;
   calculating a probability (KR) that said wafer chips fail only due to said defects by substituting the data m1, m2, m3, m4, and m5 in the formula:

$$KR = 1 - \frac{1-KR_1}{1-KR_0},$$

wherein, $KR_0 = \frac{m3}{m1-m2}$ and $KR_1 = \frac{m5}{m4}$; and substituting KR into formula:

$$DLY = \frac{k - \sum_{i}^{k} KRi}{k} \times 100(\%)$$

wherein i is 1 to k;
   wherein k is the total number of wafer chips; and
   wherein KR is the probability that wafer chips fail.

16. A system of calculating a probability of failures (KR) caused only by defects in blocks in a wafer chip comprising:
   a defect detector for inspecting said blocks to detect defects in said blocks and in blocks located around said inspected blocks; and
   a controller for measuring:
      the number of said inspected blocks having failures caused by a reason other than said defects in said inspected blocks located around said inspected blocks having said defects (n1);
      the number of said inspected blocks having no failures in said inspected blocks located around said inspected blocks having said defects (n2);

the number of inspected blocks having failures caused by said defects in said inspected blocks having said defects (n3); and the number of inspected blocks having no failures in said inspected blocks having said defects (n4); and substituting data (n1) through (n4) in formula 1a $$KR = 1 - \frac{1-KR_1}{1-KR_0}; \quad \text{wherein} \tag{1a}$$

$$KR_0 = \frac{n1}{n1+n2} \text{ and } KR_1 = \frac{n3}{n3+n4}.$$

17. A system of calculating a probability of failures caused only by defects in each chip of a wafer comprising:
    a controller for determining the total number of wafer chips (m1);
    detecting defects in each said wafer chip;
    determining the total number of chips having said defects (m2);
    determining the total number of chips which fail due to a reason other than said defects (m3);
    classifying said wafer chips having defects using probable parameters in consideration of area, size, and number of said defects;
    determining the total number of wafer chips (m4) and the total number of wafer chips which fail (m5) when said wafer chips are classified according to each said probable parameter; and
    calculating a probability (KR) that said wafer chips fail only due to said defects by substituting the data m1, m2, m3, m4, and m5 in the formula:

$$KR = 1 - \frac{1-KR_1}{1-KR_0}, \quad \text{wherein}$$

$$KR_0 = \frac{m3}{m1-m2} \text{ and } KR_1 = \frac{m5}{m4}.$$

18. A system of calculating a defect limited yield (DLY) comprising:
    a defect detector for inspecting said blocks to detect defects in said blocks and in blocks located around said inspected blocks; and
    a controller for measuring:
        the number of said inspected blocks having failures caused by a reason other than said defects in said inspected blocks located around said inspected blocks having said defects (n1);
        the number of said inspected blocks having no failures in said inspected blocks located around said inspected blocks having said defects (n2);
        the number of inspected blocks having failures caused by said defects in said inspected blocks having said defects (n3); and
        the number of inspected blocks having no failures in said inspected blocks having said defects (n4);

substituting data (n1) through (n4) in formula 1a $$KR = 1 - \frac{1-KR_1}{1-KR_0}; \tag{1a}$$

substituting KR into formula:

$$DLY = \frac{k - \sum_{i}^{k} KRi}{k} \times 100(\%),$$

wherein i is 1 to k;
wherein k is the total number of wafer chips; and
wherein KR is the probability that wafer chips fail.

19. A system of calculating a defect limited yield (DLY) comprising:
    a controller for determining the total number of wafer chips (m1);
    detecting defects in each said wafer chip;
    determining the total number of chips having said defects (m2);
    determining the total number of chips which fail due to a reason other than said defects (m3);
    classifying said wafer chips having defects using probable parameters in consideration of area, size, and number of said defects;
    determining the total number of wafer chips (m4) and the total number of wafer chips which fail (m5) when said wafer chips are classified according to each said probable parameter;
    calculating a probability (KR) that said wafer chips fail only due to said defects by substituting the data m1, m2, m3, m4, and m5 in the formula:

$$KR = 1 - \frac{1-KR_1}{1-KR_0}, \quad \text{wherein}$$

$$KR_0 = \frac{m3}{m1-m2} \text{ and } KR_1 = \frac{m5}{m4}; \text{ and}$$

substituting KR into formula:

$$DLY = \frac{k - \sum_{i}^{k} KRi}{k} \times 100(\%)$$

wherein i is 1 to k;
wherein k is the total number of wafer chips; and
wherein KR is the probability that wafer chips fail.

* * * * *